(12) United States Patent
Wakatsuki (10) Patent No.: US 11,322,441 B2
(45) Date of Patent: May 3, 2022

(54) SEMICONDUCTOR STORAGE DEVICE INCLUDING A MEMORY CELL ARRAY AND MANUFACTURING METHOD OF THE SAME

(71) Applicant: Kioxia Corporation, Tokyo (JP)

(72) Inventor: Satoshi Wakatsuki, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/012,317

(22) Filed: Sep. 4, 2020

(65) Prior Publication Data

US 2021/0296253 A1    Sep. 23, 2021

(30) Foreign Application Priority Data

Mar. 17, 2020  (JP) .............. JP2020-046781

(51) Int. Cl.
*H01L 23/532* (2006.01)
*H01L 23/538* (2006.01)
*H01L 21/768* (2006.01)
*H01L 25/065* (2006.01)

(52) U.S. Cl.
CPC .. *H01L 23/53228* (2013.01); *H01L 21/76838* (2013.01); *H01L 23/5385* (2013.01); *H01L 23/5386* (2013.01); *H01L 25/0655* (2013.01)

(58) Field of Classification Search
CPC ........... H01L 23/53228; H01L 23/5385; H01L 23/5386; H01L 21/76838; H01L 25/0655
See application file for complete search history.

(56) References Cited

U.S. PATENT DOCUMENTS

| | | | |
|---|---|---|---|
| 9,558,945 B2 | 1/2017 | Fukuzumi et al. | |
| 10,096,645 B2 | 10/2018 | Chen et al. | |
| 10,355,039 B2 | 7/2019 | Kotoo et al. | |
| 2009/0224371 A1 | 9/2009 | Yu et al. | |
| 2016/0079164 A1* | 3/2016 | Fukuzumi | H01L 21/76898 257/324 |
| 2019/0273108 A1 | 9/2019 | Sato et al. | |
| 2020/0006268 A1 | 1/2020 | Takiar et al. | |
| 2020/0194396 A1* | 6/2020 | Uzoh | H01L 25/0657 |

FOREIGN PATENT DOCUMENTS

| | | |
|---|---|---|
| JP | 2006-287022 A | 10/2006 |
| JP | 2007-220967 A | 8/2007 |
| JP | 2013-232646 A | 11/2013 |
| JP | 2016-62901 A | 4/2016 |
| JP | WO 2016/185883 A1 | 11/2016 |
| JP | 2018-92991 A | 6/2018 |
| JP | 2019-153675 A | 9/2019 |

* cited by examiner

*Primary Examiner* — Quoc D Hoang
(74) *Attorney, Agent, or Firm* — Oblon, McClelland, Maier & Neustadt, L.L.P.

(57) ABSTRACT

A semiconductor storage device according to an embodiment includes: an array chip having a memory cell array; a circuit chip having a circuit electrically connected to a memory cell; and a metal pad bonding the array chip and the circuit chip together. The metal pad includes an impurity. A concentration of the impurity is lowered as separating in a depth direction apart from a surface in a thickness direction of the metal pad.

9 Claims, 9 Drawing Sheets

SEMICONDUCTOR STORAGE DEVICE INCLUDING A MEMORY CELL ARRAY AND MANUFACTURING METHOD OF THE SAME

CROSS-REFERENCE TO RELATED APPLICATIONS

This application is based upon and claims the benefit of priority from Japanese Patent Application No. 2020-046781, filed on Mar. 17, 2020; the entire contents of which are incorporated herein by reference.

FIELD

Embodiments of the present invention relate to a semiconductor storage device and a manufacturing method of the same.

BACKGROUND

For semiconductor storage devices such as three-dimensional memories, there is known a technology of bonding metal pads respectively formed on two wafers together. With this technology, dishing arises when the metal pads are polished too much.

DETAILED DESCRIPTION

Embodiments will now be explained with reference to the accompanying drawings. The present invention is not limited to the embodiments.

A semiconductor storage device according to an embodiment includes: an array chip having a memory cell array; a circuit chip having a circuit electrically connected to a memory cell; and a metal pad bonding the array chip and the circuit chip together. The metal pad includes an impurity. A concentration of the impurity is lowered as separating in a depth direction apart from a surface in a thickness direction of the metal pad.

First Embodiment

Figure 1:
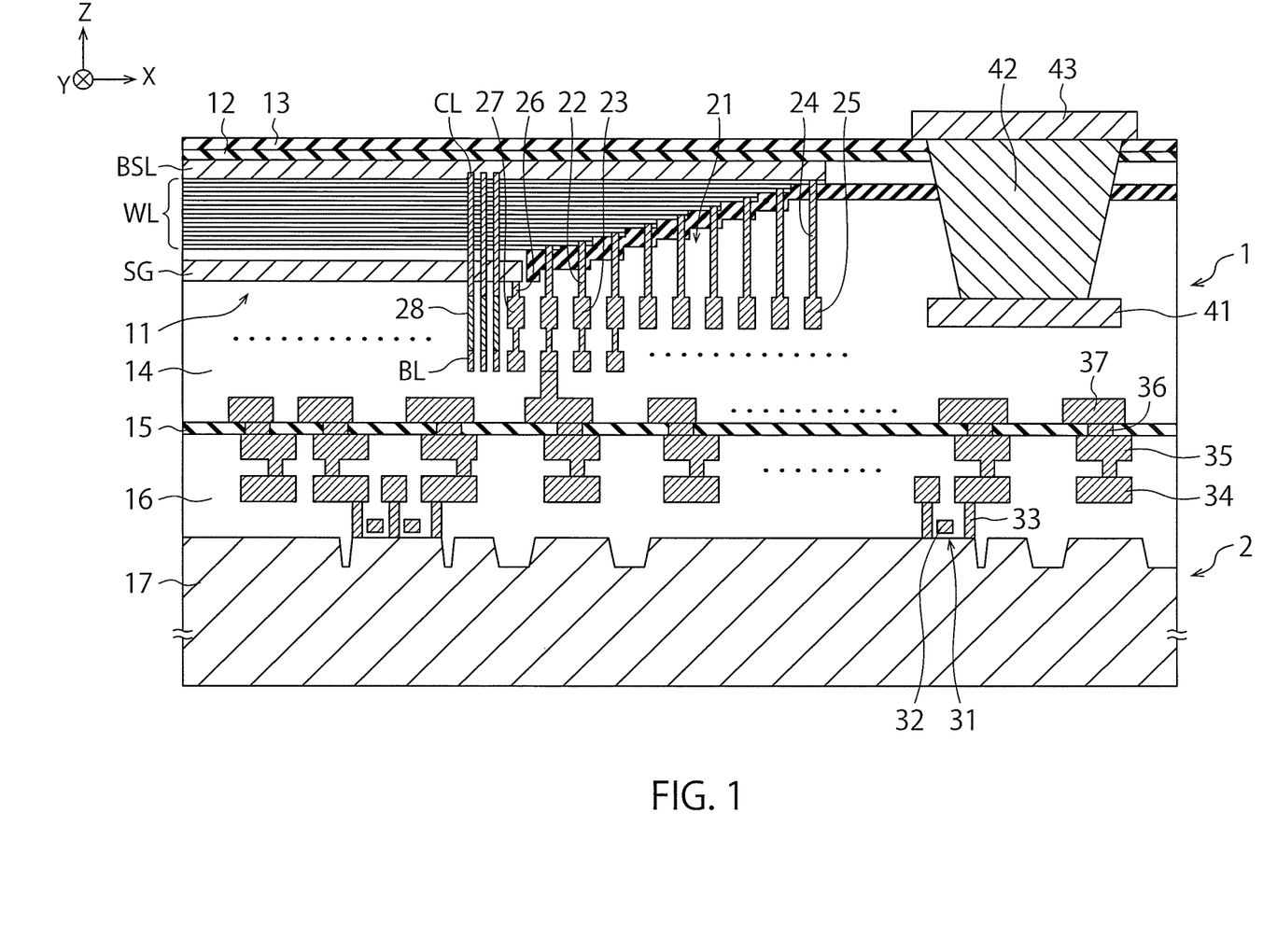
FIG. 1 is a cross sectional view showing a structure of a semiconductor storage device according to a first embodiment.

FIG. 1 is a cross sectional view showing a structure of a semiconductor storage device according to a first embodiment. The semiconductor storage device in FIG. 1 is a three-dimensional memory in which an array chip 1 and a circuit chip 2 are pasted together.

The array chip 1 includes a memory cell array 11 including a plurality of memory cells, an insulating layer 12 (for example, a silicon nitride film) on the memory cell array 11, an insulating layer 13 (for example, a silicon oxide film) on the insulating layer 12, and an interlayer insulating film 14 beneath the memory cell array 11.

Moreover, the array chip 1 includes, as electrode layers in the memory cell array 11, a plurality of word lines WL, a buried source line BSL and a selection gate SG. In a step structure part 21 of the memory cell array 11, each word line WL is electrically connected to a word wiring layer 23 via a contact plug 22. Likewise, the buried source line BSL is electrically connected to a source line 25 via a contact plug 24, and the selection gate SG is electrically connected to a selection gate wiring layer 27 via a contact plug 26. Columnar parts CL penetrating the word lines WL, the buried source line BSL and the selection gate SG are electrically connected to bit lines BL via plugs 28.

Furthermore, the array chip 1 includes a pad 41 electrically connected to a wiring layer 37 via a not-shown via plug, an external connection electrode 42 provided on the pad 41, and an external connection pad 43 provided on the external connection electrode 42. The external connection pad 43 can be connected to a mount substrate and/or another device via solder balls, metal bumps, bonding wires or the like.

The circuit chip 2 is provided beneath the array chip 1 via an insulating layer 15. The circuit chip 2 includes an interlayer insulating film 16 and a substrate 17 beneath the interlayer insulating film 16. The substrate 17 is exemplarily a semiconductor substrate such as a silicon substrate. In the following description, directions which are parallel to a surface of the substrate 17 and perpendicular to each other are regarded as an X-direction and a Y-direction, and the direction perpendicular to the surface of the substrate 17 is regarded as a Z-direction. While in the present specification, the +Z-direction is regarded as an upward direction and the −Z-direction is regarded as a downward direction, the −Z-direction may coincide or does not have to coincide with the direction of gravity.

Moreover, the circuit chip 2 includes a plurality of transistors 31. Each transistor 31 includes a gate electrode 32 provided on the substrate 17 via a gate insulating film, and not-shown source diffusion layer and drain diffusion layer provided in the substrate 17. Moreover, the circuit chip 2 includes a plurality of plugs 33 provided on the source diffusion layers or the drain diffusion layers, a wiring layer 34 provided on these plugs 33, and a wiring layer 35 provided on the wiring layer 34. The transistors 31, the plugs 33, the wiring layer 34 and the wiring layer 35 constitute a circuit electrically connected to the memory cell array 11.

A plurality of metal pads 36 are provided on the wiring layer 35. Each metal pad 36 is enclosed by the insulating layer 15. The wiring layer 37 of the array chip 1 is provided on the metal pads 36.

Figure 2:
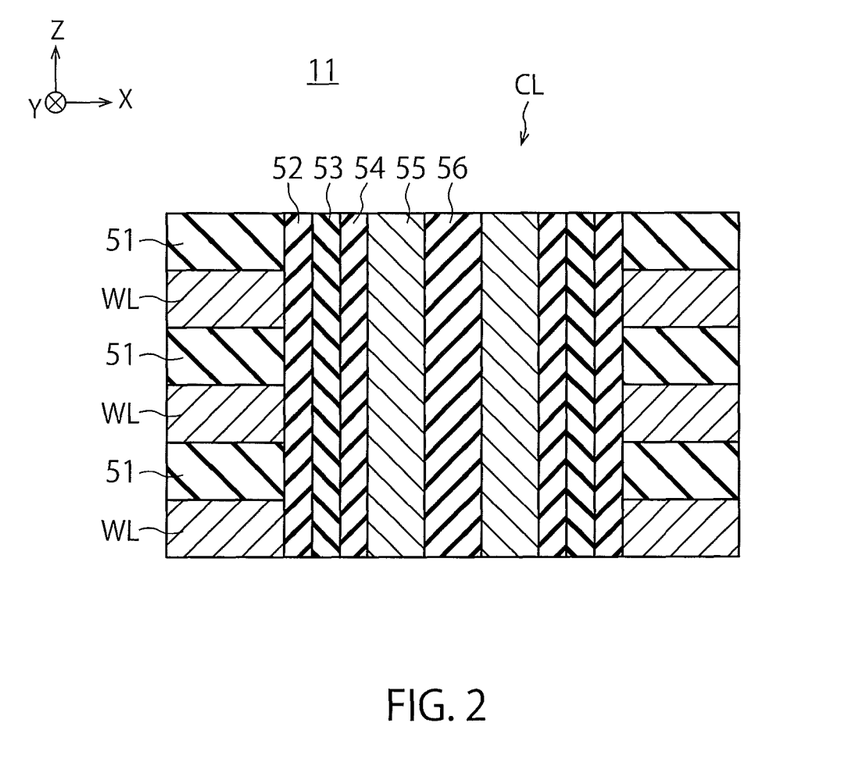
FIG. 2 is a cross sectional view showing a structure of a columnar part shown in FIG. 1.

FIG. 2 is a cross sectional view showing a structure of the columnar part CL of the array chip 1. As shown in FIG. 2, the memory cell array 11 includes the plurality of word lines WL and a plurality of insulating layers 51 which are alternately stacked on the interlayer insulating film 14. Each word line WL is exemplarily a tungsten (W) layer. Each insulating layer 51 is exemplarily a silicon oxide film.

The columnar part CL includes a block insulating film 52 which is exemplarily a first insulating film, a charge storage layer 53, a tunnel insulating film 54 which is exemplarily a second insulating film, a channel semiconductor layer 55, and a core insulating film 56. The charge storage layer 53 is exemplarily a silicon nitride film and is formed on lateral surfaces of the word lines WL and the insulating layers 51 via the block insulating film 52. The channel semiconductor layer 55 is exemplarily a silicon layer and is formed on a lateral surface of the charge storage layer 53 via the tunnel insulating film 54. The block insulating film 52, the tunnel insulating film 54 and the core insulating film 56 are exemplarily silicon oxide films and/or metal insulating film.

Hereafter, a manufacturing method of the semiconductor storage device according to the present embodiment is described.

Figure 3:
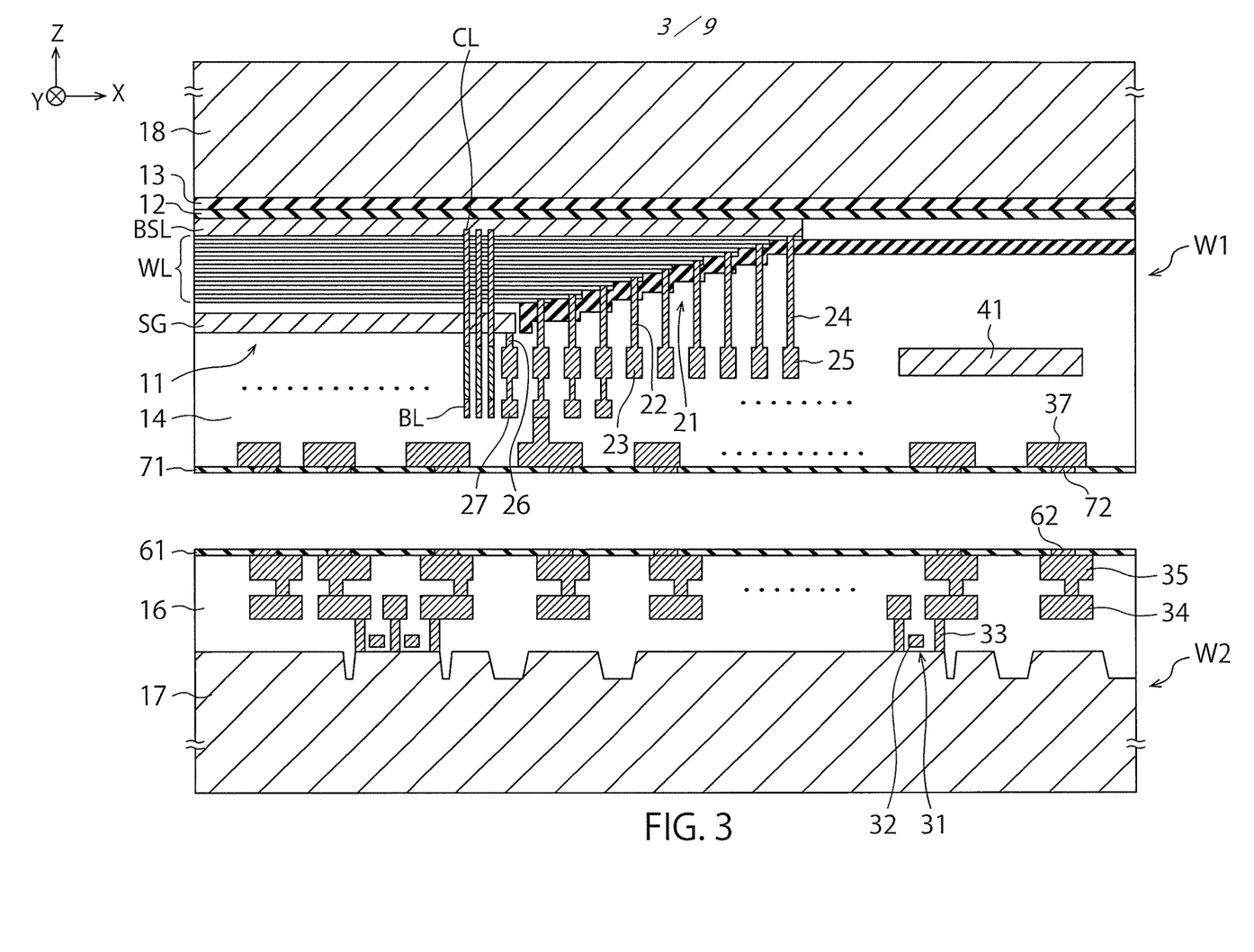
FIG. 3 is a cross sectional view showing structures of an array wafer and a circuit wafer.

First, an array wafer W1 including a plurality of array chips 1 and a circuit wafer W2 including a plurality of circuit chips 2 are formed as shown in FIG. 3. A first insulating layer 71 and a plurality of first metal pads 72 are formed at the lower surface of the array wafer W1. The first metal pads 72 are formed on the lower surface of the wiring layer 37. Moreover, as to the array wafer W1, a substrate 18 is provided on the insulating layer 13.

Meanwhile, a second insulating layer 61 and a plurality of second metal pads 62 are formed at the upper surface of the circuit wafer W2. The second metal pads 62 are formed on the upper surface of the wiring layer 35. Herein, a manufacturing method of the second metal pads 62 is described in detail with reference to FIG. 4 to FIG. 6.

Figure 4:
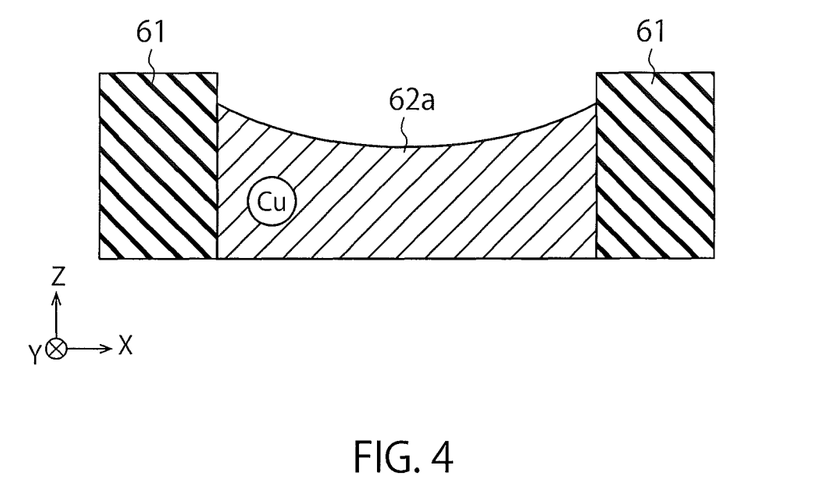
FIG. 4 is a cross sectional view showing a second metal pad after polishing.

First, second metal pads 62a a main component of which is copper (Cu) is formed on the wiring layer 35. After the second metal pads 62a are polished afterward, there occasionally arises dishing resulting from the upper surfaces of the second metal pads 62a being recessed relative to the upper surface of the second insulating layer 61 as shown in FIG. 4. In this case, this can cause defective bonding that gaps are formed at the bonding surface between the array wafer W1 and the circuit wafer W2 when they are bonded together.

Figure 5:
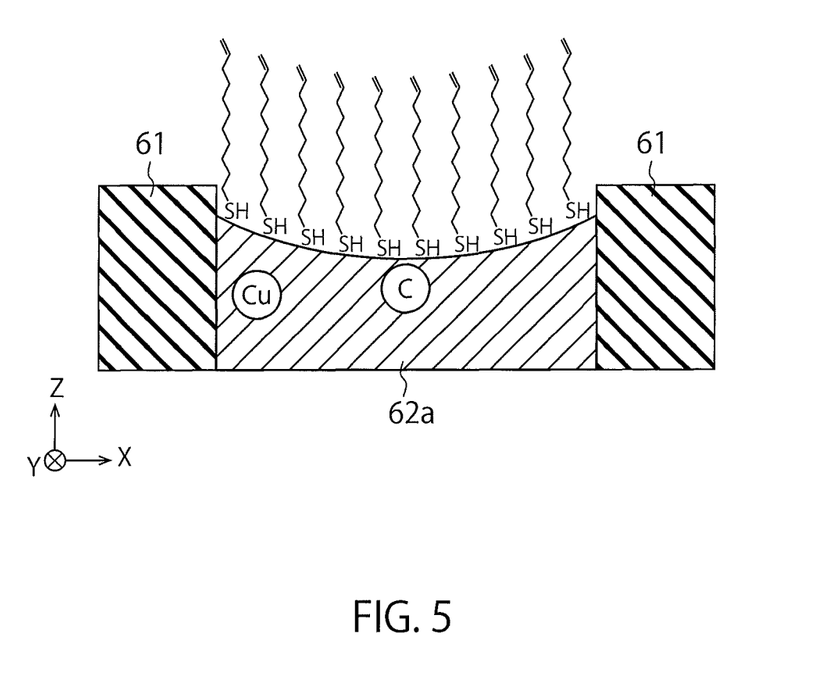
FIG. 5 is a cross sectional view showing the second metal pad having undergone an alkanethiol treatment.

Therefore, in the present embodiment, as shown in FIG. 5, gas or liquid including alkanethiol ($C_xH_yS$: x and y are natural numbers) in which carbon (C) combines with a thiol group (SH) is introduced to the second metal pad 62a. Thereby, carbon adheres, as an impurity, onto the surface of the second metal pad 62a.

Figure 6:
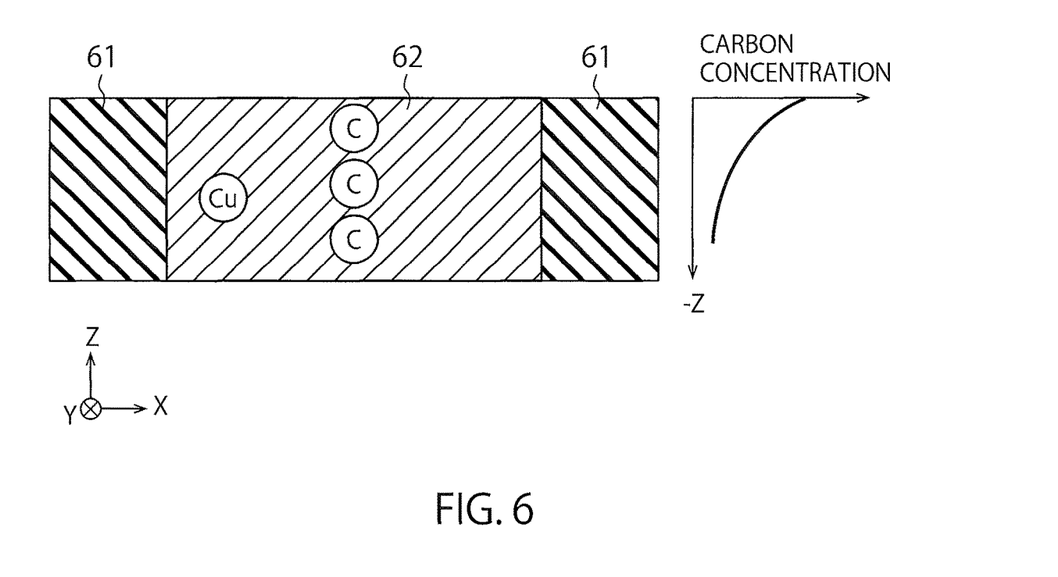
FIG. 6 is a cross sectional view showing the second metal pad having undergone a thermal treatment.

Subsequently, a thermal treatment is performed to heat the second metal pad 62a. As a result, as shown in FIG. 6, carbon diffuses into the second metal pad 62a to increase the volume of the second metal pad 62a. This completes the second metal pad 62. The upper surface of this second metal pad 62 becomes a flat surface positioned at substantially the same height as that of the upper surface of the second insulating layer 61. Moreover, as shown in FIG. 6, the second metal pad 62 has a concentration gradient at which a carbon concentration is lowered as advancing in the thickness direction (−Z-direction) from its surface (upper surface), that is, as separating in a depth direction apart from the surface.

Meanwhile, the first metal pad 72 can also be formed similarly to the second metal pad 62. Namely, when dishing has arisen in polishing the first metal pad 72 a main component of which is copper, by performing the aforementioned alkanethiol treatment and thermal treatment, the first metal pad 72 including carbon as an impurity is formed. In this case, the lower surface of the first metal pad 72 becomes a flat surface positioned at substantially the same height as that of the lower surface of the first insulating layer 71. Moreover, the first metal pad 72 also has a concentration gradient at which a carbon concentration is lowered as advancing in the thickness direction (Z-direction) from its surface (lower surface), that is, as separating in a depth direction apart from the surface.

After the first metal pads 72 and the second metal pads 62 are formed as above, the array wafer W1 and the circuit wafer W2 are pasted together under mechanical pressure. Thereby, the first insulating layer 71 and the second insulating layer 61 are adhesively bonded together to form the insulating layer 15.

Next, the array wafer W1 and the circuit wafer W2 are annealed, for example, at 400° C. Thereby, the first metal pads 72 and the second metal pads 62 are bonded together to form the plurality of metal pads 36.

Figure 7:
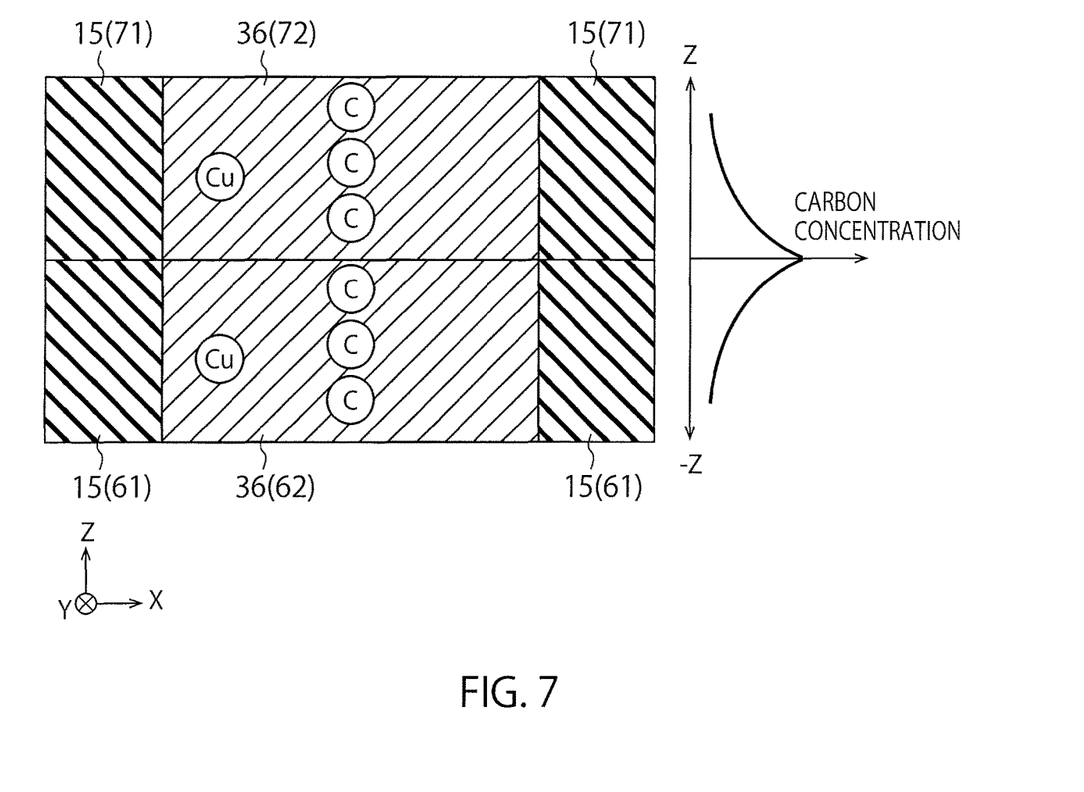
FIG. 7 is an enlarged cross sectional view of a place where the array wafer and the circuit wafer are bonded together.

FIG. 7 is an enlarged cross sectional view of the place where the array wafer W1 and the circuit wafer W2 are bonded together. As to the first metal pad 72 and the second metal pad 62 as mentioned above, the dishing has been corrected by carbon introduced thereto as the impurity. Therefore, no gap is formed at the bonding surface between the first metal pad 72 and the second metal pad 62, in other words, in a center part of the metal pad 36. Moreover, as shown in FIG. 7, the metal pad 36 has a concentration gradient at which a carbon concentration is lowered as separating in the thickness direction (Z-direction; −Z-direction) apart from its center part.

After the metal pads 36 are formed, the substrate 18 is removed by chemical mechanical polishing (CMP) or wet etching, and the array wafer W1 and the circuit wafer W2 are cut into a plurality of chips. As above, the semiconductor storage device in FIG. 1 is manufactured. Notably, the external connection electrode 42 and the external connection pad 43 are formed on the pad 41, for example, after the substrate 18 is removed.

According to the present embodiment, the volumes of the metal pads are increased by introducing carbon as an impurity to the metal pads and performing a thermal treatment. Therefore, even when dishing arises due to polishing the metal pads, the volumes of the metal pads can be increased. Thereby, defective bonding between the array chip 1 and the circuit chip 2 can be reduced.

Notably, while in the present embodiment, carbon is introduced to both the first metal pads 72 and the second metal pads 62, such introductions of carbon may be determined depending on the degrees of recess of the metal pads. Therefore, carbon may be introduced to either the first metal pads 72 or the second metal pads 62 depending on the degrees of recess of the metal pads.

Moreover, while in the present embodiment, the thermal treatment is performed before the array wafer W1 and the circuit wafer W2 are bonded together when the first metal pads 72 and the second metal pads 62 are formed, it may be performed in bonding these wafers. Since both wafers are annealed, for example, in 400° C. heat in bonding these array wafer W1 and circuit wafer W2 together, this annealing may be used for the thermal treatment. Since also in this case, the volumes are increased through diffusion of carbon having been introduced as the impurity, the first metal pads 72 and the second metal pads 62 can be bonded together with no gaps as shown in FIG. 7.

Second Embodiment

Hereafter, a second embodiment is described mainly on its differences from the first embodiment. The present embodiment is different from the first embodiment in manufacturing methods of the first metal pads 72 and the second metal pads 62. A manufacturing method of the second metal pad 62 in the present embodiment is hereafter described with reference to FIG. 8 to FIG. 10.

Figure 8:
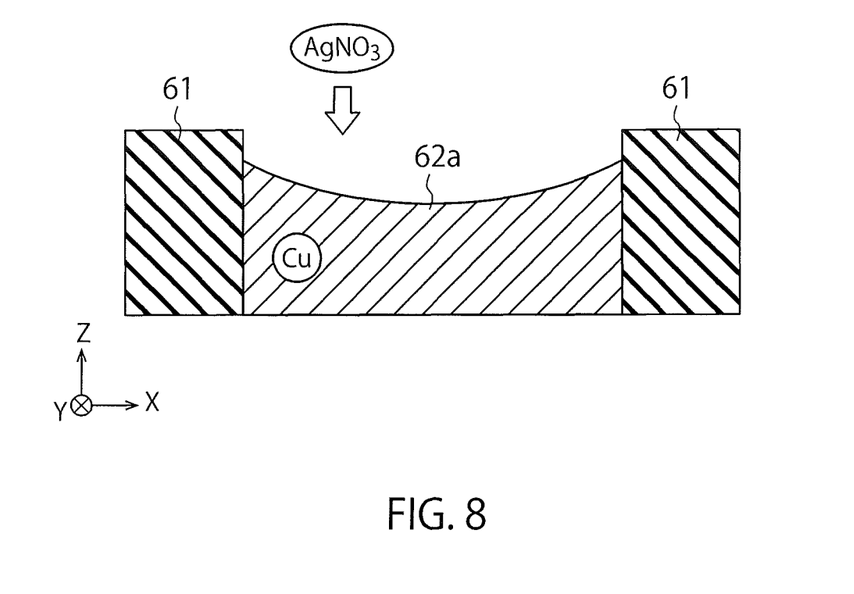
FIG. 8 is a cross sectional view showing a second metal pad to which silver nitrate is introduced.

When dishing arises on the second metal pad 62a as shown in FIG. 8, first, liquid including silver nitrate ($AgNO_3$) is introduced to the second metal pad 62a. This results in a substitution reaction expressed by formula (1) below.

$$Cu+AgNO_3 \rightarrow 2Ag+Cu(NO_3)_2 \qquad (1)$$

Figure 9:
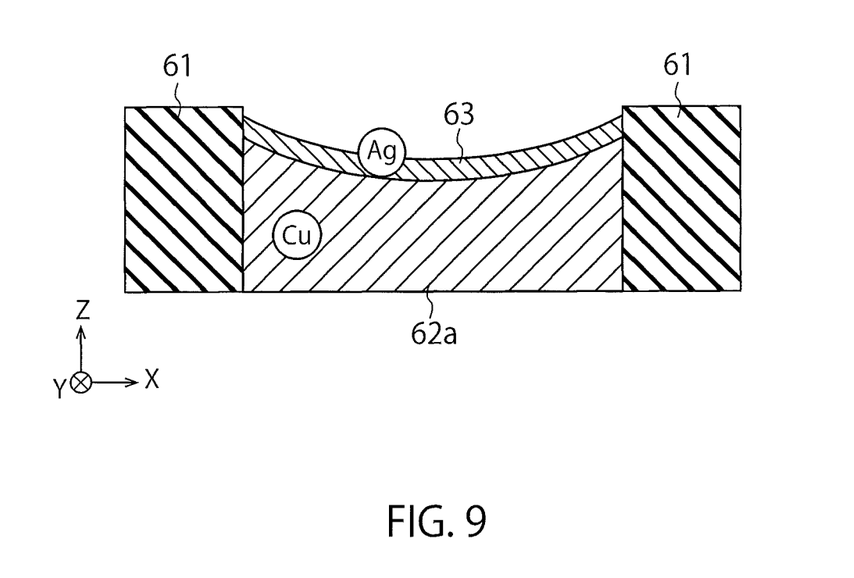
FIG. 9 is a cross sectional view showing the second metal pad on which a silver layer is formed.

The aforementioned substitution reaction allows silver to be precipitated on the surface of the second metal pad 62a to form a silver layer 63 as shown in FIG. 9.

Figure 10:
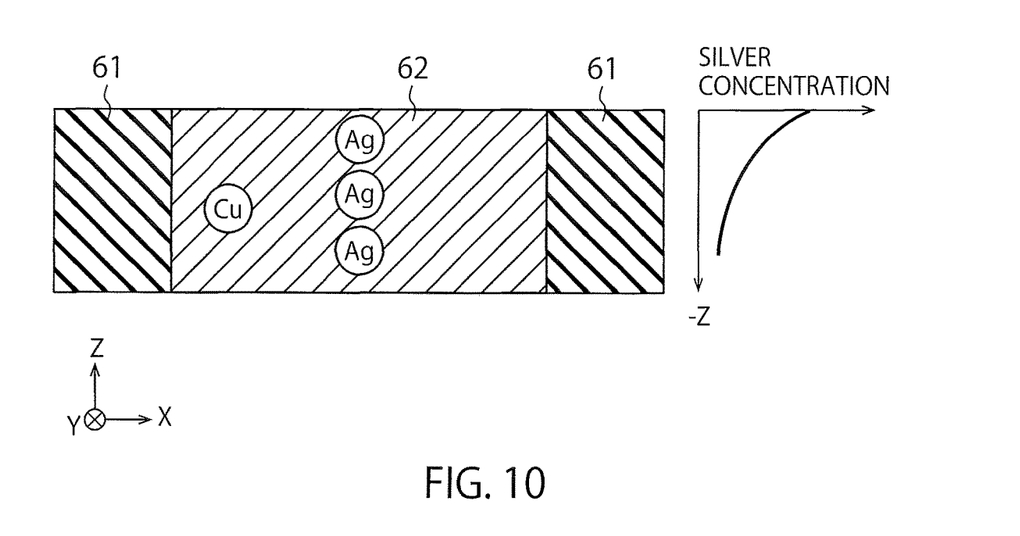
FIG. 10 is a cross sectional view showing the second metal pad having undergone a thermal treatment.

Next, a thermal treatment is performed to heat the second metal pad 62a. As a result, as shown in FIG. 10, silver diffuses into the second metal pad 62a to increase the volume of the second metal pad 62a. This completes the second metal pad 62. The upper surface of this second metal pad 62 becomes a flat surface positioned at substantially the same height as that of the upper surface of the second insulating layer 61 similarly to the first embodiment. Moreover, as shown in FIG. 10, the second metal pad 62 has a concentration gradient at which a silver concentration is lowered as advancing in the thickness direction (−Z-direction) from its surface (upper surface).

Meanwhile, the first metal pad 72 can also be formed similarly to the second metal pad 62. Namely, when dishing has arisen in polishing the first metal pad 72 a main component of which is copper, by performing the aforementioned substitution reaction and thermal treatment, the first metal pad 72 including silver as an impurity is formed. In this case, the lower surface of the first metal pad 72 becomes a flat surface positioned at substantially the same height as that of the lower surface of the first insulating layer 71 similarly to the first embodiment. Moreover, the first metal pad 72 also has a concentration gradient at which a silver concentration is lowered as advancing in the thickness direction (Z-direction) from its surface (lower surface).

After that, similarly to the first embodiment, the array wafer W1 and the circuit wafer W2 are pasted together under mechanical pressure to form the insulating layer 15. Furthermore, the array wafer W1 and the circuit wafer W2 are annealed, for example, at 400° C. to form the plurality of metal pads 36.

Figure 11:
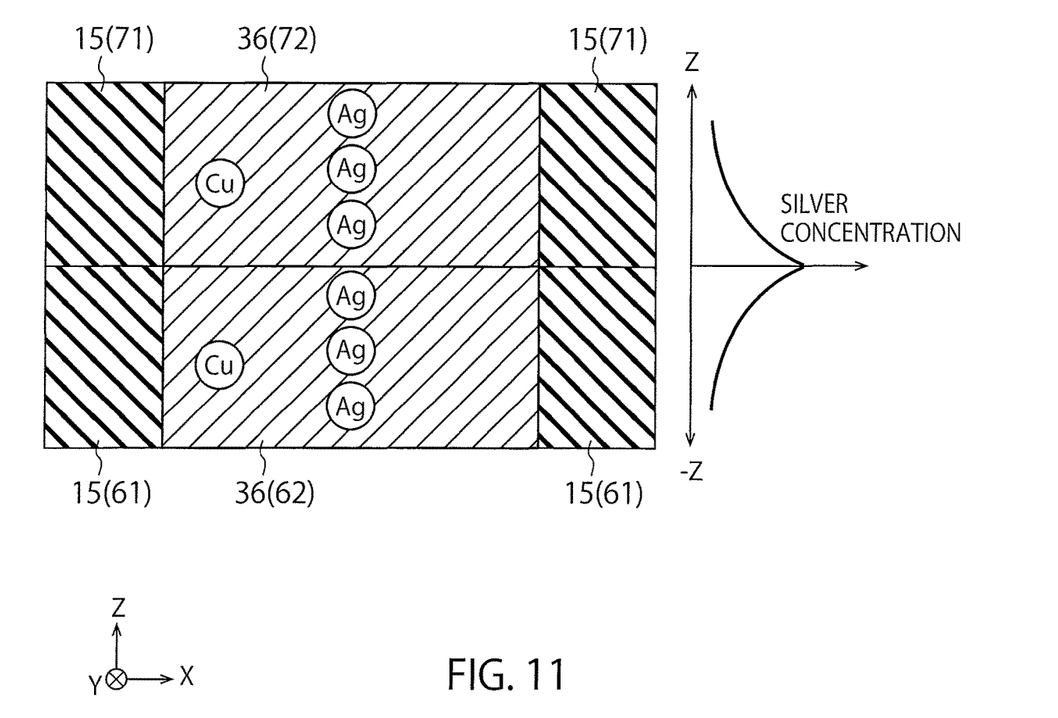
FIG. 11 is an enlarged cross sectional view of a place where the array wafer and the circuit wafer are bonded together.

FIG. 11 is an enlarged cross sectional view of the place where the array wafer W1 and the circuit wafer W2 are bonded together. As to the first metal pad 72 and the second metal pad 62 as mentioned above, the dishing has been corrected by silver introduced thereto as the impurity. Therefore, no gap is formed in the center part of the metal pad 36. Moreover, as shown in FIG. 11, the metal pad 36 has a concentration gradient at which a silver concentration is lowered as separating in the thickness direction (Z-direction; −Z-direction) apart from its center part.

According to the present embodiment, the volumes of the metal pads are increased by introducing silver as an impurity to the metal pads and performing a thermal treatment. Therefore, even when dishing arises due to polishing the metal pads, the volumes of the metal pads can be increased. Thereby, defective bonding between the array chip 1 and the circuit chip 2 can be reduced.

Notably, while in the present embodiment, silver nitrate is introduced to the second metal pads 62a, silver chloride (AgCl) may be introduced in place of silver nitrate. Since silver is precipitated on the surfaces of the second metal pads 62a also in this case, the thermal treatment can increase the volumes of the second metal pads 62a.

Moreover, as to the introduction of silver nitrate or silver chloride, it may be introduced to either the first metal pads 72 or the second metal pads 62 depending on the degrees of recess of the metal pads after polishing similarly to the first embodiment.

Third Embodiment

Hereafter, a third embodiment is described mainly on its differences from the first embodiment. The present embodiment is different from the first embodiment in manufacturing methods of the first metal pads 72 and the second metal pads 62. A manufacturing method of the second metal pad 62 in the present embodiment is hereafter described with reference to FIG. 12 and FIG. 13.

Figure 12:
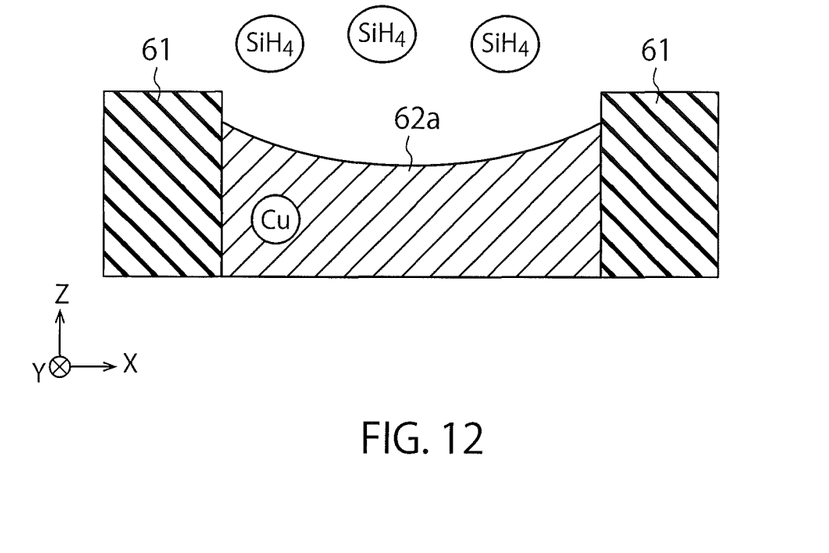
FIG. 12 is a cross sectional view showing a second metal pad having undergone a thermal treatment in a silane atmosphere.
Figure 13:
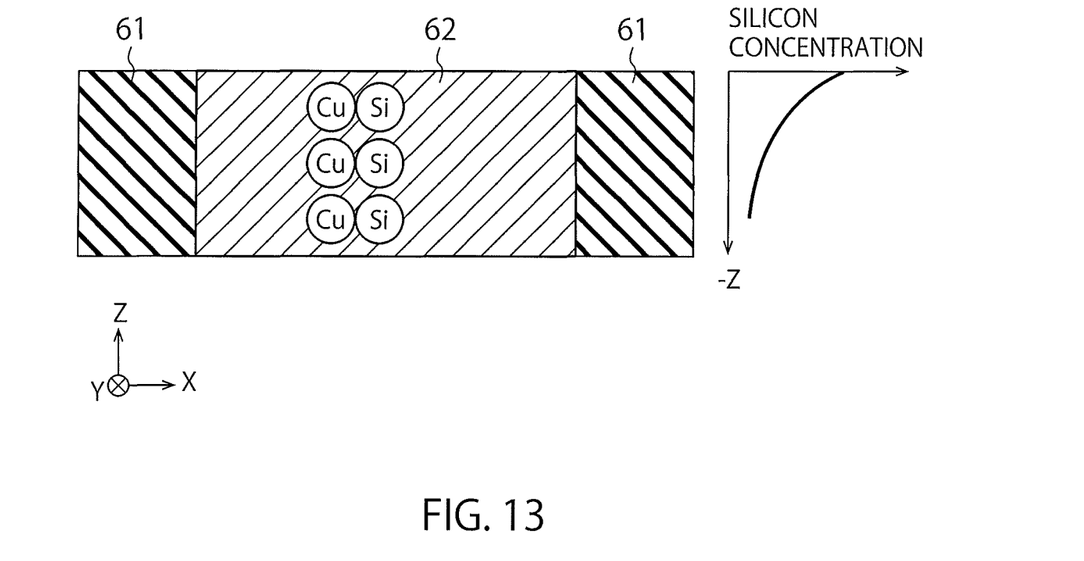
FIG. 13 is a cross sectional view showing the second metal pad in which silicide is formed.

When dishing arises on the second metal pad 62a as shown in FIG. 12, first, a thermal treatment is performed on the second metal pad 62a under a silane ($SiH_4$) atmosphere. As a result, as shown in FIG. 13, silicide in which copper included in the second metal pad 62a combines with silicon included in silane is generated to increase the volume of the second metal pad 62a. This completes the second metal pad 62. The upper surface of this second metal pad 62 becomes a flat surface positioned at substantially the same height as that of the upper surface of the second insulating layer 61 similarly to the first embodiment. Moreover, as shown in FIG. 13, the second metal pad 62 has a concentration gradient at which a silicon concentration is lowered as advancing in the thickness direction (−Z-direction) from its surface (upper surface).

Meanwhile, the first metal pad 72 can also be formed similarly to the second metal pad 62. Namely, when dishing has arisen in polishing the first metal pad 72 a main component of which is copper, by performing the aforementioned thermal treatment under a silane atmosphere, the first metal pad 72 including silicon as an impurity is formed. In this case, the lower surface of the first metal pad 72 becomes a flat surface positioned at substantially the same height as that of the lower surface of the first insulating layer 71 similarly to the first embodiment. Moreover, the first metal pad 72 also has a concentration gradient at which a silicon concentration is lowered as advancing in the thickness direction (Z-direction) from its surface (lower surface).

After that, similarly to the first embodiment, the array wafer W1 and the circuit wafer W2 are pasted together under mechanical pressure to form the insulating layer 15. Furthermore, the array wafer W1 and the circuit wafer W2 are annealed, for example, at 400° C. to form the plurality of metal pads 36.

Figure 14:
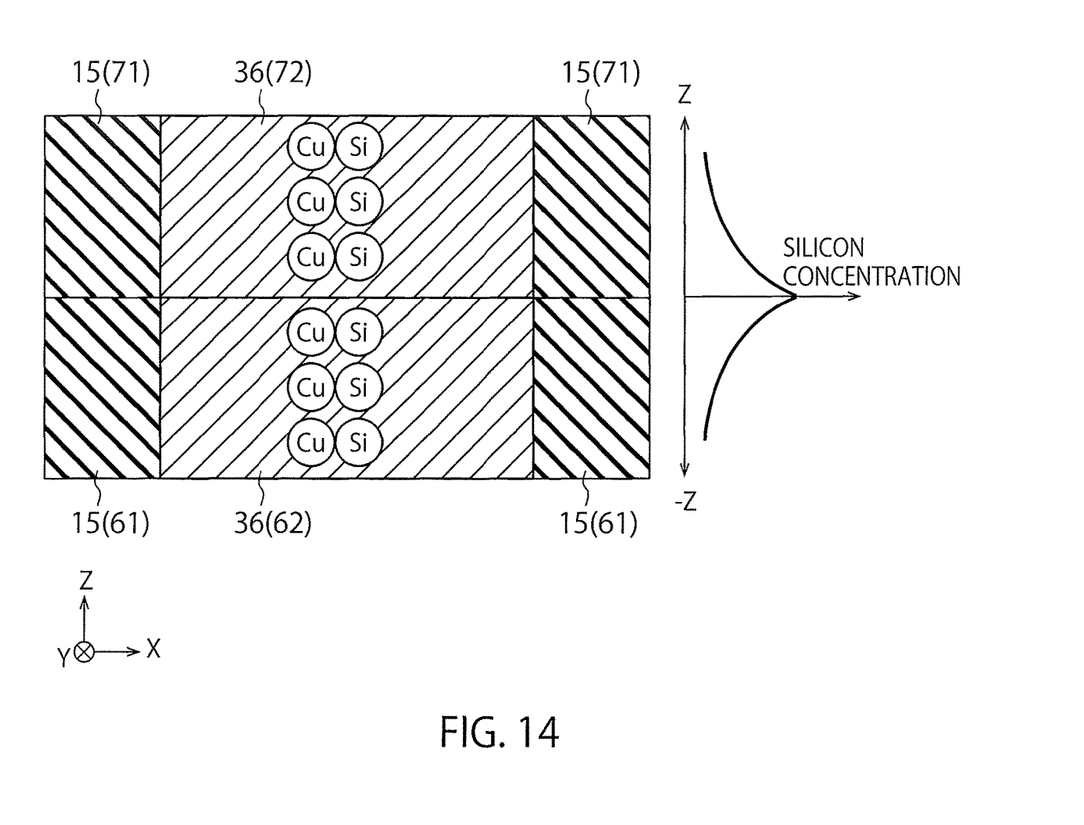
FIG. 14 is an enlarged cross sectional view of a place where the array wafer and the circuit wafer are bonded together.

FIG. 14 is an enlarged cross sectional view of the place where the array wafer W1 and the circuit wafer W2 are bonded together. As to the first metal pad 72 and the second metal pad 62 as mentioned above, the dishing has been corrected by silicon introduced thereto as the impurity.

Therefore, no gap is formed in the center part of the metal pad 36. Moreover, as shown in FIG. 14, the metal pad 36 has a concentration gradient at which a silicon concentration is lowered as separating in the thickness direction (Z-direction; −Z-direction) apart from its center part.

According to the present embodiment, the volumes of the metal pads are increased by introducing silicon as an impurity to the metal pads. Therefore, even when dishing arises due to polishing the metal pads, the volumes of the metal pads can be increased. Thereby, defective bonding between the array chip 1 and the circuit chip 2 can be reduced.

Notably, while in the present embodiment, the thermal treatment is performed under a silane atmosphere, the thermal treatment may be performed under a disilane ($Si_2H_6$) atmosphere. Since silicide in which copper combines with silicon diffuses in the second metal pads 62a also in this case, the volumes of the second metal pads 62a can be increased.

Moreover, in the present embodiment, the thermal treatment under a silane atmosphere or a disilane atmosphere may be performed in bonding the array wafer W1 and the circuit wafer W2 together. Since the array wafer W1 and the circuit wafer W2 are annealed, for example, in 400° C. heat in bonding the array wafer W1 and the circuit wafer W2 together, this annealing may be used for the thermal treatment of the metal pads. Since diffusion of silicon introduced as the impurity increases the volumes of the metal pads also in this case, the first metal pads 72 and the second metal pads 62 can be bonded together with no gaps as shown in FIG. 14.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A semiconductor storage device comprising:
    an array chip having a memory cell array;
    a circuit chip having a circuit electrically connected to the memory cell array; and
    a metal pad bonding the array chip and the circuit chip together, wherein
    the metal pad includes an impurity, and a concentration of the impurity is lowered as separating in a depth direction apart from a surface in a thickness direction of the metal pad,
    wherein the metal pad includes a first metal pad provided in the array chip and a second metal pad provided in the circuit chip, and the concentration of the impurity in the metal pad is highest at a bonding surface between the first metal pad and the second metal pad.

2. The semiconductor storage device according to claim 1, wherein
    the metal pad includes copper (Cu), and
    the impurity is one of carbon (C), silver (Ag) and silicon (Si).

3. A manufacturing method of a semiconductor storage device comprising:
    forming a first metal pad on a surface of an array wafer having a memory cell array;
    forming a second metal pad on a surface of a circuit wafer having a circuit electrically connected to the memory cell array;
    introducing an impurity to at least one of the first metal pad and the second metal pad;
    performing a thermal treatment on the metal pad to which the impurity is introduced; and
    pasting the array wafer and the circuit wafer together to bond the first metal pad and the second metal pad together.

4. The manufacturing method of a semiconductor storage device according to claim 3, wherein
    the first metal pad and the second metal pad are formed of copper,
    alkanethiol ($C_xH_yS$: x and y are natural numbers) is introduced to at least one of the first metal pad and the second metal pad, and
    the thermal treatment is performed on the metal pad to which the alkanethiol is introduced.

5. The manufacturing method of a semiconductor storage device according to claim 4, wherein the thermal treatment is performed when the first metal pad and the second metal pad are bonded together.

6. The manufacturing method of a semiconductor storage device according to claim 3, wherein
    the first metal pad and the second metal pad are formed of copper,
    silver nitrate ($AgNO_3$) or silver chloride (AgCl) is introduced to at least one of the first metal pad and the second metal pad, and
    the thermal treatment is performed on the metal pad to which the silver nitrate or the silver chloride is introduced.

7. The manufacturing method of a semiconductor storage device according to claim 6, wherein the thermal treatment is performed when the first metal pad and the second metal pad are bonded together.

8. The manufacturing method of a semiconductor storage device according to claim 3, wherein
    the first metal pad and the second metal pad are formed of copper, and
    the thermal treatment is performed on at least one of the first metal pad and the second metal pad under a silane ($SiH_4$) atmosphere or a disilane ($Si_2H_6$) atmosphere.

9. The manufacturing method of a semiconductor storage device according to claim 8, wherein the thermal treatment is performed when the first metal pad and the second metal pad are bonded together.

* * * * *